United States Patent [19]
Hogeboom

[11] Patent Number: 5,334,951
[45] Date of Patent: Aug. 2, 1994

[54] PHASE LOCK LOOPS AND METHODS FOR THEIR OPERATION

[75] Inventor: John G. Hogeboom, Nepean, Canada

[73] Assignee: Northern Telecom Limited, Montreal, Canada

[21] Appl. No.: 19,583

[22] Filed: Feb. 18, 1993

[51] Int. Cl.⁵ .............................................. H03L 7/00
[52] U.S. Cl. ..................................... 331/1 A; 331/17
[58] Field of Search ................ 331/1 A, 8, 17, 25, 331/57; 328/155, 133

[56] References Cited

U.S. PATENT DOCUMENTS

| | | | |
|---|---|---|---|
| 4,857,866 | 8/1989 | Tateishi | 331/1 A |
| 4,885,552 | 12/1989 | Boudewijns | 331/1 A |
| 5,103,191 | 4/1992 | Werker | 331/17 |
| 5,121,085 | 6/1992 | Brown | 331/8 |
| 5,136,253 | 8/1992 | Ueno | 328/133 |
| 5,136,260 | 8/1992 | Yousefi-Elezei | 331/17 |
| 5,208,555 | 5/1993 | Graham et al. | 331/17 |
| 5,257,294 | 10/1993 | Pinto et al. | 375/120 |
| 5,278,520 | 1/1994 | Parker et al. | 331/1 A |

OTHER PUBLICATIONS

"Design of PLL-Based Clock Generation Circuits", IEEE Journal of Solid-State Circuits, vol. SC-22, No. 2, Apr. 1987, pp. 255-261.

*Primary Examiner*—Raymond A. Nelli
*Attorney, Agent, or Firm*—C. W. Junkin

[57] ABSTRACT

A phase lock loop comprises a voltage controlled oscillator, a phase detector and a loop filter comprising a charge pump and a filter network. The voltage controlled oscillator generates an output signal having a frequency which is responsive to a control voltage. The phase detector is responsive to the output signal and to a reference signal to generate a control signal indicative of a phase difference of the output signal and the reference signal. The charge pump is responsive to the control signal and to the control voltage to apply a charge indicative of both the phase difference and the control voltage to the filter network to develop the control voltage. Because the charge supplied by the charge pump depends on the control voltage as well as the phase difference of the output signal and the reference signal, the rate of adjustment of the output signal frequency depends on the present output signal frequency. Consequently, there is a normalization of performance with respect to operating frequency which provides more stable and predictable performance characteristics over a given range of operating frequencies.

25 Claims, 5 Drawing Sheets

PHASE LOCK LOOPS AND METHODS FOR THEIR OPERATION

FIELD OF THE INVENTION

This invention relates to phase lock loops and to methods for their operation. More particularly, this invention relates to phase lock loops employing charge pumps to control voltage controlled oscillators.

BACKGROUND OF THE INVENTION

A known phase lock loop (PLL) configuration comprises a voltage controlled oscillator (VCO), a phase detector and a loop filter comprising a charge pump and a filter network. The phase detector is responsive to an output signal of the VCO and to a reference signal to generate a control signal which is indicative of a phase difference of the output signal and the reference signal. The charge pump is responsive to the control signal to apply a charge indicative of the phase difference to the filter network, thereby developing a control voltage across the filter network. The control voltage is applied to the VCO to control the frequency of the VCO output signal.

An example of this phase lock loop configuration is disclosed in Jeong et al, IEEE Journal of Solid State circuits, Vol. SC-22, No. 2, April 1987, pp. 255–261.

Unfortunately, the performance of such phase lock loops can vary significantly over a range of operating frequencies or in response to different operating conditions. Moreover, when such phase lock loops are implemented in integrated circuit form, their performance may vary significantly due to parameter changes resulting from slight variations in the manufacturing processes used to fabricate the integrated circuits.

SUMMARY OF THE INVENTION

This invention seeks to provide phase lock loops having performance which is less variable with respect to operating frequency, operating conditions and manufacturing processes than conventional phase lock loops employing charge pumps to control VCOs.

Accordingly, one aspect of the invention provides a phase lock loop which comprises a voltage controlled oscillator, a phase detector, and a loop filter comprising a charge pump and a filter network. The voltage controlled oscillator generates an output signal having a frequency which is responsive to a control voltage. The phase detector is responsive to the output signal and to a reference signal to generate a control signal indicative of a phase difference of the output signal and the reference signal. The charge pump is responsive to the control signal and to the control voltage to apply a charge indicative of both the phase difference and the control voltage to the filter network to develop the control voltage.

Because the charge supplied by the charge pump depends on the control voltage as well as the phase difference of the output signal and the reference signal, the rate of adjustment of the output signal frequency depends on the present output signal frequency. Consequently, there is a normalization of performance with respect to operating frequency which provides more stable and predictable performance characteristics over a given range of operating frequencies.

To achieve even better normalization of performance with respect to operating frequency in some embodiments of the invention, the filter network may have an admittance which is responsive to the control voltage. Preferably, the charge pump, the filter network admittance and the voltage controlled oscillator are responsive to the control voltage such that a given phase difference of the output signal and the reference signal causes a change in the output signal frequency which is approximately proportional to the output signal frequency.

In some embodiments of the invention, the charge pump is responsive to the control signal and to the control voltage to generate current pulses tot application to the filter network. The current pulses have a magnitude indicative of the control voltage, and a duration and a direction indicative of the phase difference.

Advantageously, if the voltage controlled oscillator is responsive to the control voltage such that the frequency of the output signal has a particular functional dependence on the control voltage, the charge pump is made responsive to the control voltage such that the magnitude of the current pulses has a functional dependence on the control voltage which is substantially proportional to the functional dependence of the output signal frequency on the control voltage. The filter network is made responsive to the control voltage such that a resistive admittance of the filter network has a functional dependence on the control voltage which is substantially proportional to the first derivative of the functional dependence of the output signal frequency on the control voltage. Ideally, a capacitive admittance of the filter network has a functional dependence on the control voltage which is substantially proportional to the product of the reciprocal of the functional dependence of the output signal frequency on the control voltage and the first derivative of the functional dependence or the output signal frequency on the control voltage.

In one embodiment, the filter network comprises a pair of charge pumps and a filter network, each of the charge pumps being responsive to the control signal and to the control voltage to apply a charge indicative of both the phase difference and the control voltage to the filter network to develop the control voltage. Where the filter network comprises a resistive admittance and a capacitive admittance, one of the charge pumps may apply charge to the resistive admittance to determine a first order response of the phase lock loop, and the other of the charge pumps may apply charge to the capacitive admittance to determine a second order response of the phase lock loop. The filter network may further comprise a voltage-to-current converter which is responsive to a voltage across the capacitive admittance to apply a current to the resistive admittance. Ideally, the current-to-voltage admittance has an exponential transconductance.

This invention also seeks to provide methods for operating phase lock loops such that their performance is less variable with respect to operating frequency, operating conditions and manufacturing processes than conventional phase lock loops employing charge pumps to control VCOs.

Accordingly, another aspect of the invention provides a method for operating a phase lock loop. The method comprises generating an output signal having a frequency which is responsive to a control voltage, detecting a phase difference of the output signal and a reference signal, and applying a charge indicative of both the phase difference and the control voltage to a filter network to develop the control voltage.

Because the charge supplied by the charge pump depends on the control voltage as well as the phase difference of the output signal and the reference signal, the rate of adjustment of the output signal frequency depends on the present output signal frequency, so there is a normalization of performance with respect to operating frequency. This normalization provides more stable and predictable performance characteristics over a given range of operating frequencies.

In some embodiments of the invention, even better normalization of performance with respect to operating frequency can be obtained by varying an admittance of the filter network in response to the control voltage.

Preferably, the charge applied to the filter network and the admittance of the filter network are varied in response to the control voltage such that a given phase difference of the output signal and the reference signal causes a change in the output signal frequency which is approximately proportional to the output signal frequency.

In some embodiments of the invention, current pulses are generated for application to the filter network, the current pulses having a magnitude indicative of the control voltage, and a duration and a direction indicative of the phase difference. If the frequency of the output signal has a particular functional dependence on the control voltage, the magnitude of the current pulses may have a functional dependence on the control voltage which is substantially proportional to the functional dependence of the output signal frequency on the control voltage. A resistive admittance of the filter network may have a functional dependence on the control voltage which is substantially proportional to the first derivative of the functional dependence of the output signal frequency on the control voltage.

In one embodiment, identical charges indicative of both the phase difference and the control voltage are applied to two distinct nodes of the filter network to develop the control voltage. A response of the filter network to one of the charges determines a first order response of the phase lock loop, and a response of the filter network to the other of the charges determines a second order response of the phase lock loom.

BRIEF DESCRIPTION OF THE DRAWINGS

Embodiments of the invention are described below by way of example only. Reference is made to accompanying drawings, in which.

DESCRIPTION OF EMBODIMENTS

Figure 1:
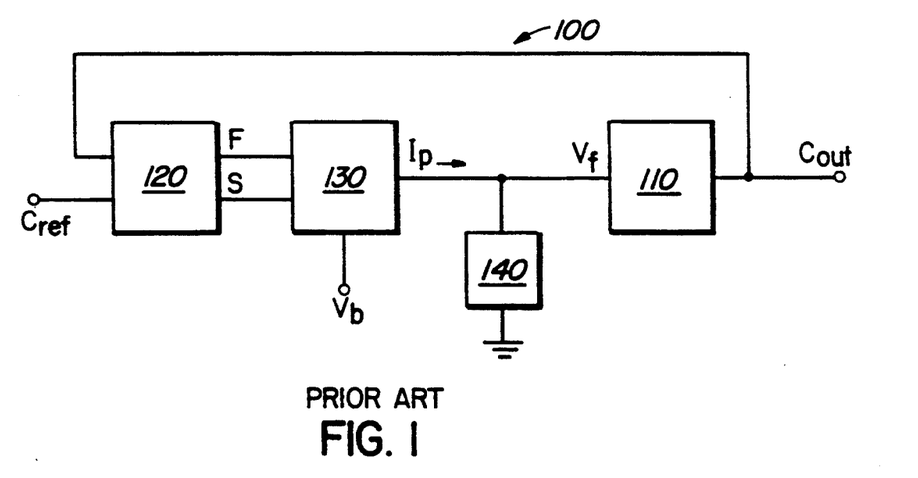
FIG. 1 is a block schematic diagram of a conventional phase lock loop which employs a charge pump to control a voltage controlled oscillator.

FIG. 1 is a block schematic diagram of a conventional phase lock loop (PLL) 100. The PLL 100 comprises a voltage controlled oscillator (VCO) 110, a phase detector 120 and a loop filter comprising a charge pump 130 and a filter network 140.

The phase detector 120 is responsive to an output signal $C_{out}$ of the VCO 110 and to a reference signal $C_{ref}$ to generate a control signal. The control signal comprises two pulse trains F,S which are indicative of a phase difference of the output signal $C_{out}$ and the reference signal $C_{ref}$. If the output signal $C_{out}$ lags the reference signal $C_{ref}$, pulses in pulse train F are wider (i.e., of longer duration) than pulses in pulse train S. However, if the output signal $C_{out}$ leads the reference signal $C_{ref}$, pulses in pulse train S are wider (i.e. of longer duration) than pulses in pulse train F. The pulse trains F,S typically have opposite polarity. A possible circuit implementation of the phase detector 120 is disclosed in FIG. 3(a) of Jeong et al, IEEE Journal of Solid State Circuits, vol. SC-22, No. 2, April 1987pp. 255–261, which is hereby incorporated by reference.

The charge pump 130 is a switched current source responsive to the pulse trains F,S to apply a charge indicative of the phase difference to the filter network 140. Application of that charge to the filter network 140 develops a control voltage $V_f$ across the filter network 140. The control voltage $V_f$ is applied to the VCO 110 to control the frequency of the output signal $C_{out}$.

Figure 2:
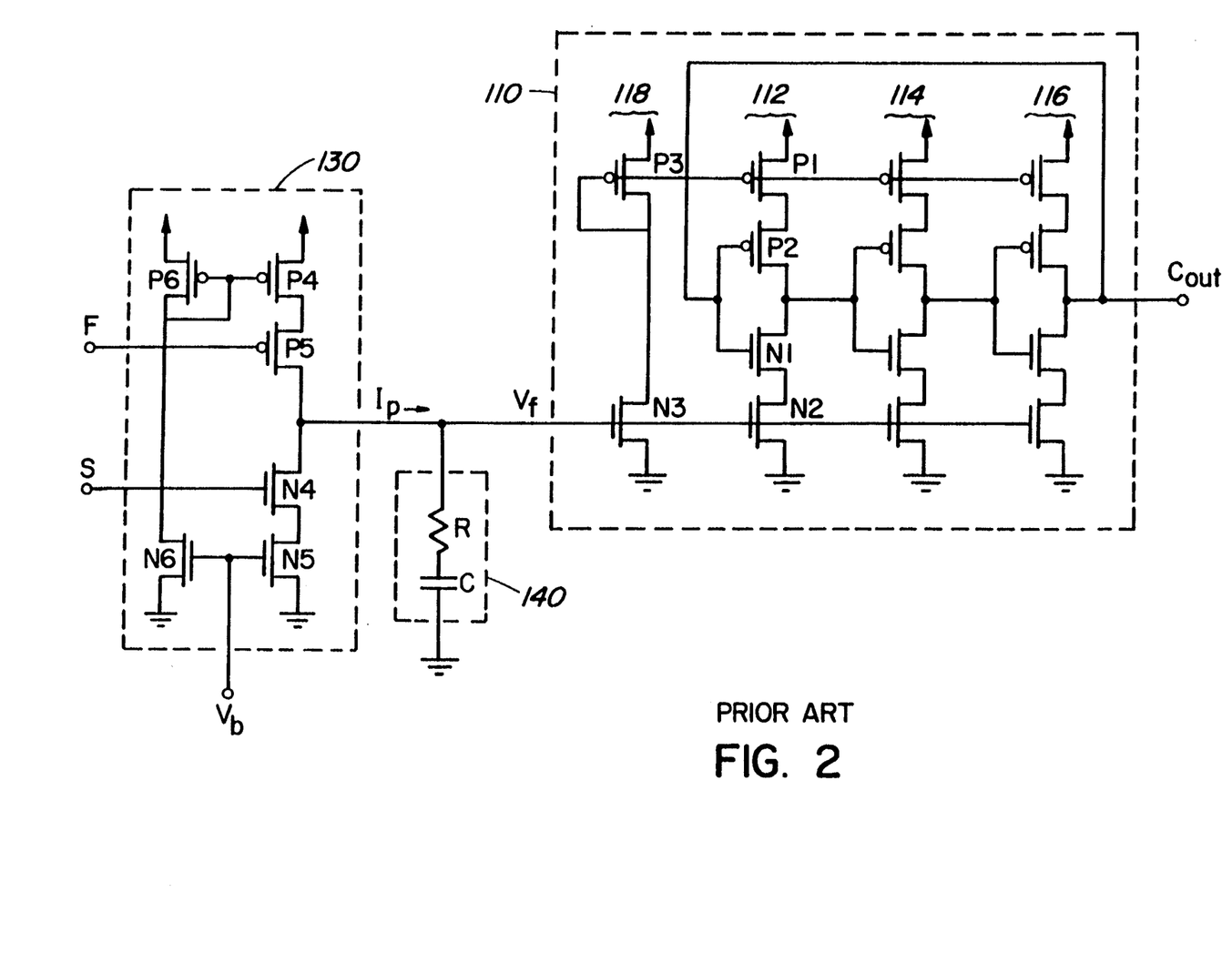
FIG. 2 is a circuit schematic diagram showing CMOS implementations for a charge pump, a filter network and a voltage controlled oscillator of the phase lock loop of FIG. 1.

FIG. 2 is a circuit schematic diagram showing CMOS implementations for the VCO 110, charge pump 130 and filter network 140 of the PLL 100.

The VCO 110 comprises three CMOS inverters 112, 114, 116. Each inverter 112, 114, 116 comprises first and second p channel MOSFETs P1, P2, and first and second n channel MOSFETs N1, N2 connected as shown in FIG. 2. The inverters 112, 114, 116 are series connected, output terminal to input terminal to define a ring. The VCO 110 also includes a current mirror 118 comprising a p channel MOSFET P3 and an n channel MOSFET connected as shown in FIG. 2. The current mirror 118 ensures that the currents in the n channel and p channel transistors of the inverters 112, 114, 116 are balanced so that the output signal $C_{out}$ of the VCO 110 has a symmetrical waveform. The maximum current supplied by each inverter 112, 114, 116 is determined by the control voltage $V_f$ which controls the admittances of MOSFETs P1 and N2. The maximum current limits the slew rate of each inverter 112, 114, 116, thereby determining the oscillation frequency of the VCO 110. The frequency of the VCO 110 is approximately proportional to the square of the control voltage $V_f$.

The charge pump 130 comprises first and second channel MOSFETs P4, P5, and first and second n channel MOSFETs N4, N5 connected as shown in FIG. 2. The charge pump 130 also includes a current mirror comprising a p channel MOSFET P6 and an n channel MOSFET N6 connected as shown in FIG. 2. The pulse trains F,S switch transistors P4, N3 to source or sink a current $I_p$ into or out of the filter network 140 as a series of current pulses or charge increments. The current mirror P6, N6 ensures balanced biasing of the p channel transistors P4, P5 and the N channel transistors N4, N5. A bias voltage $V_b$ determines the magnitude of the current $I_p$. Consequently, the current pulses supplied by the charge pump 130 have a duration and direction indicative of the phase difference of the output signal $C_{out}$ and the reference signal $C_{ref}$, and a fixed magnitude $I_p$ determined by the bias voltage $V_b$.

The filter network 140 comprises a resistance R in series with a capacitance C, the resistance R providing a first order response proportional to the instantaneous current, and the capacitance C providing a second order response proportional to the incremental charge to develop the control voltage $V_f$.

Unfortunately, the performance of the conventional PLL 100 can vary significantly over a range of operating frequencies or in response to different operating conditions as discussed above. According to one aspect of this invention, such performance variation can be reduced by modifying the PLL 100 so that the change in the output signal frequency for a given phase difference of the output signal $C_{out}$ and the reference signal $C_{ref}$ is approximately proportional to the present value of the output signal frequency. This condition can be met by modifying the charge pump 130 so that the charge it supplies in response to a given detected phase difference is scaled according to the current operating frequency of the VCO 110. It is also generally appropriate to modify the filter network 140 so that its admittance is also scaled according to the current operating frequency of the VCO 110.

Figure 3:
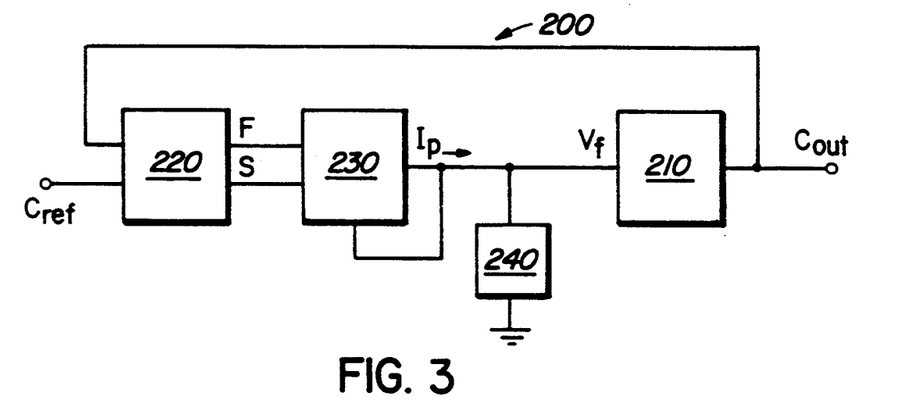
FIG. 3 is a block schematic diagram of a phase lock loop according to an embodiment of the invention.

FIG. 3 is a block schematic diagram of a PLL 200 according to an embodiment of the invention. Like the conventional PLL 100, the PLL 200 comprises a VCO 210, a phase detector 220 and a loop filter comprising a charge pump 230 and a filter network 240. However, unlike the charge pump 130 of the conventional PLL 100, the charge pump 230 is responsive to the control voltage $V_f$ as well as the control signal (again comprising two pulse trains F, S). Unlike the filter network 140 of the conventional PLL 100, the filter network 240 has an admittance which also depends on the control voltage $V_f$.

In particular, the VCO 210 is responsive to the control voltage $V_f$ such that the output signal frequency has a functional dependence $f=F(V_f)$ on the control voltage $V_f$. The charge pump 230 is responsive to the control voltage $V_f$ such that the magnitude $I_p$ of the current pulses has a functional dependence on the control voltage $V_f$ which is substantially proportional to the functional dependence $F(V_f)$ of the output signal frequency on the control voltage. The filter network 240 is responsive to the control voltage $V_f$ such that a resistive admittance of the filter network 240 has a functional dependence on the control voltage $V_f$ which is substantially proportional to the first derivative of the functional dependence of the output signal frequency on the control voltage $dF(V_f)/dV_f$. This scaling of the charge pump current $I_p$ and the resistive admittance of the filter network 240 ensures that the change in the output signal frequency for a given phase difference of the output signal $C_{out}$ and the reference signal $C_{ref}$ is approximately proportional to the present value of the output signal frequency.

In many implementations, the filter network 240 will comprise a series connection of the resistive admittance and a capacitive admittance. In this case, the capacitive admittance ideally should have a functional dependence $C(V_f)$ which is substantially proportional to the product of the reciprocal of the functional dependence of the output signal frequency on the control voltage and the first derivative of the functional dependence of the output signal on the control voltage (i.e. $C(V_f)=[k/F(V_f)][dF(V_f)/dV_f]$). In practice, such a voltage-variable capacitance may not be easily arranged. However, scaling the charge pump current $I_p$ and the resistive component of the filter network admittance as detailed above ensures that the first order response of the PLL 200 is scaled to the operating frequency as desired. Scaling of the second order response of the PLL 200 by varying the capacitive admittance with the control voltage $V_f$ primarily affects the long term performance of the PLL 200, and therefore is less critical.

Figure 4:
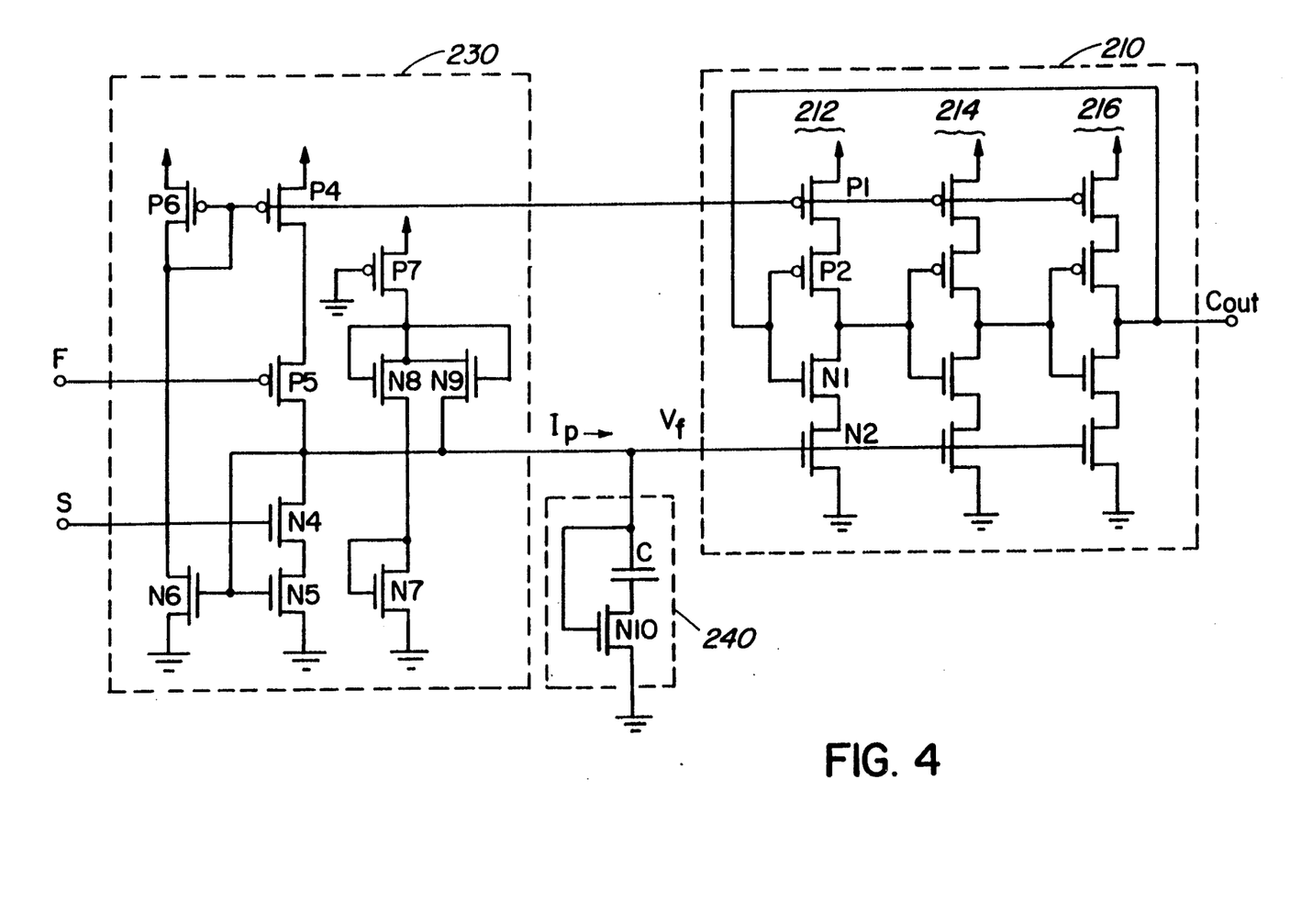
FIG. 4 is a circuit schematic diagram showing CMOS implementations for a charge pump, a filter network and a voltage controlled oscillator of the phase lock loop of FIG. 3.

FIG. 4 is a circuit schematic diagram showing CMOS implementations of the VCO 210, the charge pump 230 and the filter network 240.

The charge pump 230 is essentially the same as the charge pump 130 of the conventional PLL 100, except that the bias voltage $V_b$ is replaced by the control voltage $V_f$ which is fed back to the gates of transistors P4, P6, N4, N6 of the charge pump 230. The charge pump 230 operates as a switched current source in response to the control signal F,S as described above for the charge pump 130 of the conventional PLL 100, except that the magnitude $I_p$ of the current pulses supplied by the charge pump 230 is variable in response to the control voltage $V_f$.

The charge pump 230 also includes a bias circuit comprising three n-channel MOSFETs N7, N8, N9 and one p channel MOSFET P7 connected as shown in FIG. 4. Two of the MOSFETs N7, N8 have relatively low impedances because they have relatively wide channels, and the other two MOSFETs P7, N9 have relatively high impedances because they have relatively narrow channels. The bias circuit operates to apply a momentary bias to the control voltage node when the PLL 200 is started up to ensure that the initial value of the charge pump current $I_p$ is non-zero. Otherwise the PLL 200 might fail to start operation. The bias circuit shuts down once the control voltage $V_f$ exceeds the threshold voltage of MOSFET N9.

The VCO 210 is essentially the same as the VCO 110 of the conventional PLL 100, except that the current mirror 118 is omitted. Because the control voltage $V_f$ now biases the current mirror P6, N6 of the charge pump 230, that current mirror can be used to ensure that the currents in the n channel and p channel transistors of the inverters 212, 214, 216 are balanced, and no additional current mirror is needed in the VCO 210.

Moreover, because the transistors P4, P5, N4, N5 are matched to corresponding transistors P1, P2, N2 of the inverters 212, 214, 216 of the VCO 210 and have the same configurations and bias voltage $F_f$, the current $I_p$ of the charge pump 230 varies in proportion to the maximum current in each inverter 212, 214, 216 of the VCO 210.

The filter network 240 comprises a capacitance C and an n channel MOSFET N10 connected as shown in FIG. 4. The MOSFET N10 provides a resistive admittance which varies in response to the control voltage $V_f$.

For typical MOSFETs operated beyond pinch-off, the drain-to-source current is approximately proportional to the square of the bias voltage minus the threshold voltage, $V_{tn}$. The bias voltage for MOSFETs N2, N4 and N5 is the control voltage $V_f$. Consequently, the maximum current of each inverter 212, 214, 216 of the VCO 210 and the frequency of the output signal $C_{out}$ are both approximately proportional to $(V_f - V_{tn})^2$. The magnitude $I_p$ of the current pulses supplied by the charge pump 230 is also approximately proportional to $(V_f - V_{tn})^2$, and is therefore directly proportional to the frequency of the output signal $C_{out}$ of the VCO 210. The resistive admittance of the filter network 240 is determined by the n channel MOSFET N7, which is biased at the same operating point as matched transistors N2, N5 of the VCO 210 and charge pump 230 respectively. This admittance is proportional to the first derivative of the current with respect to the control voltage $V_f$, which is directly proportional to the first derivative of the output signal frequency with respect to the control voltage $V_f$ because the output signal frequency is directly proportional to the current. Thus, the conditions specified above for the charge pump current magnitude $I_p$ and the resistive component of the filter network admittance are met.

The capacitance C of the filter network 240 is fixed and therefore does not meet the conditions specified above for ideal operation. For ideal operation, the capacitance C should vary in proportion to the reciprocal of $(V_f - V_{tn})$. However, as discussed above, variation of the capacitance C with the control voltage $V_f$ is not critical to good operation of the PLL 200 over an extended range of frequencies.

The capacitance C is normally large enough that in must be implemented as a discrete capacitor external to any integrated circuit implementing the rest of the PLL 200. Because this external capacitor is ungrounded, it can couple noise to the control voltage node of the PLL 200, degrading its performance.

Figure 5:
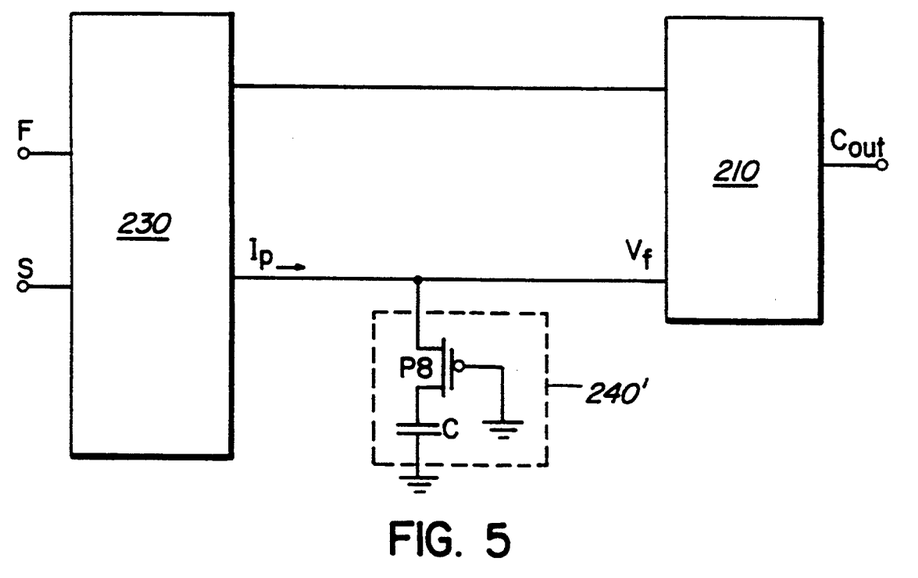
FIG. 5 is a circuit schematic diagram showing an alternative embodiment for the filter network of the phase lock loop of FIG. 3.

FIG. 5 illustrates an alternative CMOS embodiment 240' of the filter network 240 of the PLL 200. The filter network 240' comprises a p channel MOSFET P8 and a capacitance C connected in series between the control voltage node and ground. Because the capacitance C is grounded in this filter network 240', noise coupling is greatly reduced. However, the conductance of the MOSFET P8 may not vary with the control voltage $V_f$ in proportion with $dF(V_f)/dV_f$ as desired if the p channel MOSFET P8 and the n channel MOSFETs N2, N5 which control operation of the VCO 210 and the charge pump 230 have threshold voltages $V_{tp}$, $V_{tn}$ which differ significantly. Deviation of the filter network MOSFET conductance from the desired variation will be greatest if the control voltage $V_f$ is less than or approximately equal to the threshold voltages $V_{tp}$, $V_{tn}$. Consequently, the largest deviations from normalized operation occur at low operating frequencies. Provided that the sum of the p channel threshold voltage $V_{tp}$ and the n channel threshold voltage $V_{tn}$ is not negative, appropriate biasing of the gate of the filter network transistor P8 may reduce performance degradations due to the unequal threshold voltages.

Figure 6:
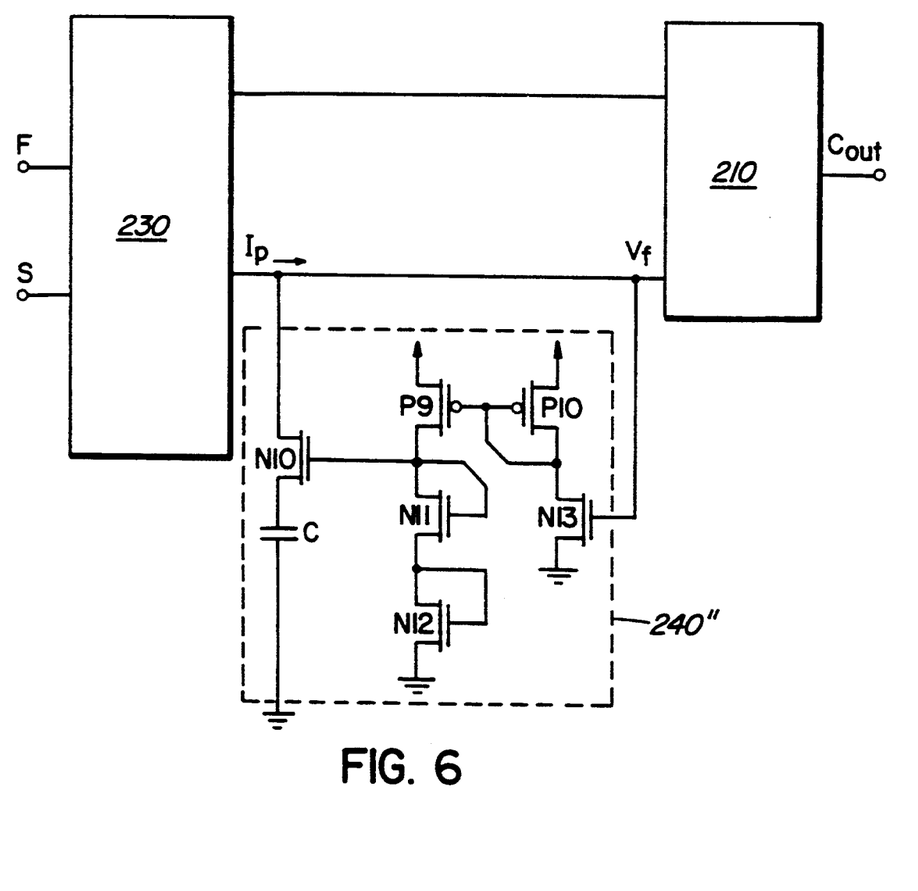
FIG. 6 is a circuit schematic diagram showing another alternative embodiment for the filter network of the phase lock loop of FIG. 3.

FIG. 6 illustrates another CMOS embodiment 240'' of the filter network 240 of the PLL 200. Like the filter network 240', the capacitance C of the filter network 240'' is grounded for reduced noise susceptibility. However, the p channel MOSFET P8 of the filter network 240' is replaced with an n channel MOSFET N10 for better tracking of the filter network conductance with $dF(V_f)/dV_f$. The filter network 240'' further comprises a bias circuit comprising p channel MOSFETs P9, P10 and n channel MOSFETs N11, N12, N13 connected as shown in FIG. 6. The bias circuit is required to bias the n channel MOSFET N10 at a voltage approximately equal to twice the control voltage $V_f$ plus any threshold shift caused by operation of the substrate and source of MOSFET N10 at different voltages. This bias voltage requirement limits the control voltage $V_f$ to less than about one half of the supply voltage.

Figure 7:
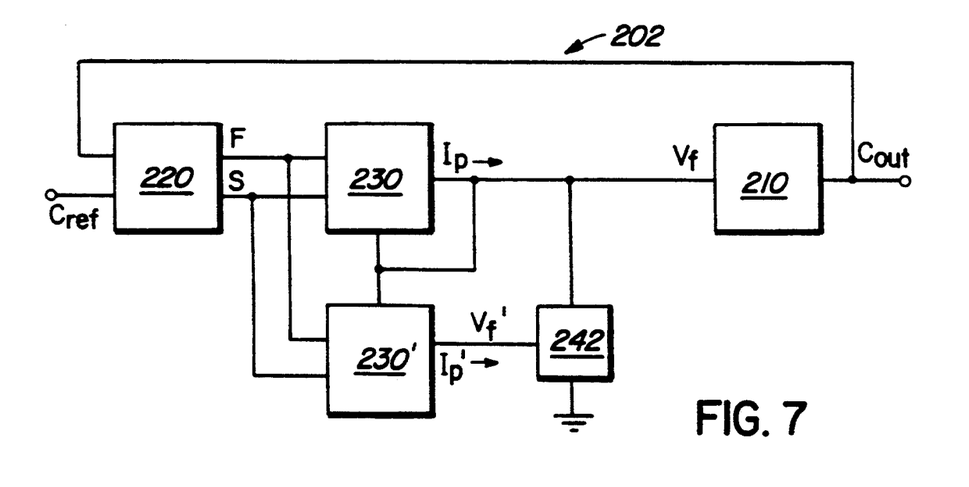
FIG. 7 is a block schematic diagram of a phase lock loop according to another embodiment of the invention.

FIG. 7 is a block schematic diagram of a PLL 202 according to another embodiment of the invention. The PLL 202 comprises a VCO 210, a phase detector 220 and a first charge pump 230 similar to corresponding functional blocks of the PLL 200 described above. However, the PLL 202 further comprises a second charge pump 230' and a modified filter network 242 which is responsive to charges supplied by both the first and second charge pumps 230, 230' to develop the control voltage $V_f$.

Figure 8:
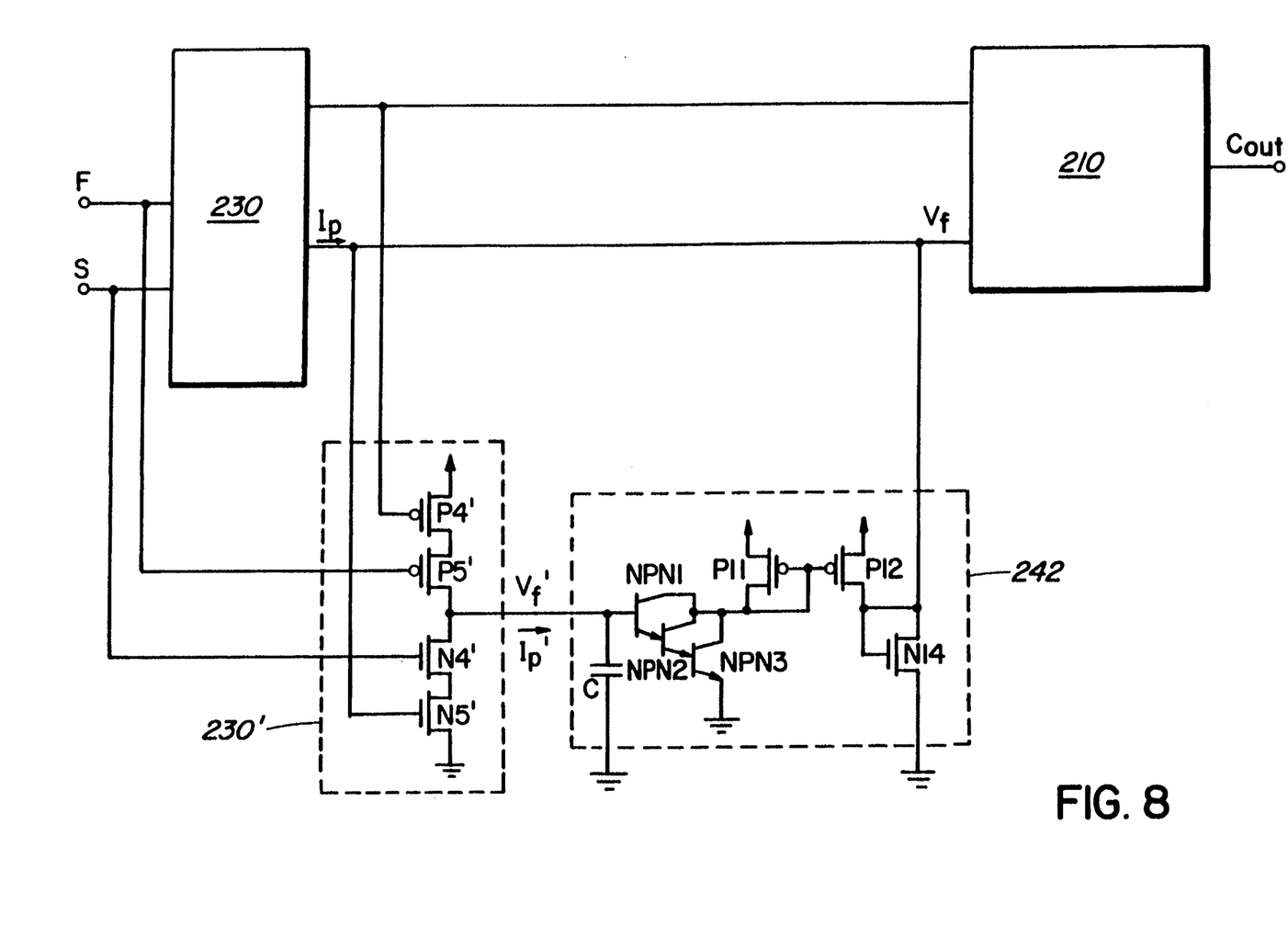
FIG. 8 is a circuit schematic diagram showing implementations for a second charge pump and the filter network of the phase lock loop of FIG. 7.

FIG. 8 is a circuit schematic diagram showing implementations for the second charge pump 230' and the modified filter network 242. The second charge pump 230' is identical to the first charge pump 230 (which is described in detail above with reference to FIG. 4), except that the bias circuit comprising MOSFETs N7, N8, N9 and P7 is omitted.

The modified filter network 242 comprises a capacitive admittance in the form of a capacitor C and a resistive admittance in the form of an n channel MOSFET N14. The capacitive admittance C and the resistive admittance N14 are linked by a voltage-to-current converter comprising three bipolar transistors NPN1, NPN2, NPN3 in a Darlington configuration and a pair of p channel MOSFETs P11, P12 in a current mirror configuration as shown in FIG. 8.

In operation of the PLL 202, the first and second charge pumps 230, 230' each respond to the control signal F, S and the control voltage $V_f$ to generate current pulses having a magnitude indicative of the control voltage $V_f$, and a duration and direction indicative of the phase difference between the reference clock signal $C_{ref}$ and the output clock signal $C_{out}$ as described in detail above. The first charge pump 230 applies its current pulses to the resistive admittance N14 of the filter network 242 to determine a first order response of the PLL 202. The second charge pump 230' applies its current pulses to the capacitive admittance C of the filter network 242 to determine a second order response of the PLL 202. The current-to-voltage converter NPN1, NPN2, NPN3, P11, P12 responds to the voltage $V_f$ across the capacitive admittance C resulting from the current pulses $I_p$ supplied by the second charge pump 230' to supply additional current to the resistive admittance N14 so that the control voltage $V_f$ responds to both first and second order responses of the filter network 242.

If the capacitive admittance C and the resistive admittance were supplied by a single charge pump, the low impedance presented by the resistive admittance N14 would disrupt integration of the charge pump current $I_{p'}$ by the capacitive C over an extended period of time. Consequently, the second charge pump 230' having an output isolated from the resistive admittance N14 is provided to supply charge to the capacitive admittance C. The Darlington configuration of bipolar transistors NPN1, NPN2, NPN3 is used in the voltage-to-current converter to provide an exponential transconductance characteristic without unacceptably loading the capacitive admittance C.

Gains associated with the first and second order responses of the PLL 202 can be tailored separately to provide desired operating characteristics. The first order gain is essentially determined by a ratio of the width of the resistive admittance device N14 to the width of n channel devices N2, N5, N5' of the VCO 210 and the charge pumps 230, 230' respectively, these devices being operated at the same bias voltages and being matched in all characteristics other than width. The first order response provides relatively fast modulation of the operating frequency. The second order gain is essentially determined by the transconductance characteristics of the voltage-to-current converter NPN1, NPN2, NPN3, P11, P12. The second order response provides a slower modulation of the operating frequency, effectively setting a coarse adjustment of the operating frequency about which the first order response makes fine adjustments. Nevertheless, the inertia of the capacitance C and the action of the second charge pump 230' move the coarse adjustment asymptotically toward the exact average frequency of the PLL 202.

The exponential transconductance characteristic of the current-to-voltage converter NPN1, NPN2, NPN3, P11, P12 is ideal for scaling the second order response of the PLL 202 to the current operating frequency. However, as mentioned above, scaling of the second order response to the operating frequency is less critical than scaling the first order response to the operating frequency. Consequently, alternative voltage-to-current converters having different transconductance characteristics (e.g. linear or square law transconductance characteristics) may provide acceptable results for some applications. Such alternative voltage-to-current converters can be readily constructed from MOS devices and are therefore suitable for fabrication in technologies which do not provide bipolar transistors.

In the PLL 202, the capacitive admittance is connected to ground for good noise immunity. Moreover, the PLL 202 does not rely on a special bias circuit to bias the resistive admittance device N14 at the same operating point as n channel transistors N2, N5, N5' of the VCO 210 and charge pumps 230, 230' respectively. The effectiveness of such bias circuits can depend on tight control of manufacturing processes.

PLLs employing the principles of the invention can be implemented in technologies other than CMOS. In bipolar and BiCMOS implementations, some care must be taken avoid saturation of bipolar devices and to minimize degradations due to base currents. These and other modifications of the embodiments described above are within the scope of the invention as claimed below.

I claim:

1. A phase lock loop, comprising:
a voltage controlled oscillator for generating an output signal having a frequency which is responsive to a control voltage;
a phase detector responsive to the output signal and to a reference signal to generate a control signal indicative of a phase difference of the output signal and the reference signal; and
a loop filter comprising a charge pump and a filter network, the charge pump being responsive to the control signal and to the control voltage to apply a charge indicative of both the phase difference and the control voltage to the filter network to develop the control voltage.

2. A phase lock loop as defined in claim 1, wherein the filter network has an admittance which is responsive to the control voltage.

3. A phase lock loop as defined in claim 2, wherein the charge pump, the loop filter network admittance and the voltage controlled oscillator are responsive to the control voltage such that a given phase difference of the output signal and the reference signal causes a change in the frequency of the output signal which is approximately proportional to the frequency of the output signal.

4. A phase lock loop as defined in claim 1, wherein the charge pump comprises a bias circuit for applying an initial bias to the filter network to develop an initial control voltage sufficient to start operation of the charge pump.

5. A phase lock loop as defined in claim 1, wherein the charge pump is responsive to the control signal and to the control voltage to generate current pulses for application to the filter network, the current pulses having a magnitude indicative of the control voltage, and a duration and a direction indicative of the phase difference.

6. A phase lock loop as defined in claim 5, wherein:
the voltage controlled oscillator is responsive to the control voltage such that the output signal frequency has a particular functional dependence on the control voltage;
the charge pump is responsive to the control voltage such that the magnitude of the current pulses has a functional dependence on the control voltage which is substantially proportional to the functional dependence of the output signal frequency on the control voltage; and
the filter network is responsive to the control voltage such that a resistive admittance of the filter network has a functional dependence on the control voltage which is substantially proportional to the first derivative of the functional dependence of the output signal frequency on the control voltage.

7. A phase lock loop as defined in claim 6, wherein the filter network is responsive to the control voltage such that a capacitive admittance of the filter network has a functional dependence on the control voltage which is substantially proportional to the product of the reciprocal of the functional dependence of the output signal frequency on the control voltage and the first derivative of the functional dependence of the output signal on the control voltage.

8. A phase lock loop as defined in claim 5, wherein:
the voltage controlled oscillator comprises a plurality of series connected inverters, each inverter supplying a maximum current effectively determined by the control voltage and characteristics of a field effect transistor;
the charge pump comprises a switched current source supplying a maximum current effectively determined by the control voltage and characteristics of a field effect transistor; and
the filter network comprises a resistive admittance which is responsive to the control voltage and a capacitive admittance.

9. A phase lock loop as defined in claim 8, wherein each inverter of the voltage controlled oscillator comprises:

a first p channel MOSFET having a drain connected to a positive voltage supply, a gate connected to a bias voltage node and a source;

a second p channel MOSFET having a drain connected to the source of the first p channel MOSFET, a gate connected to an input terminal of the inverter and a source connected to an output terminal of the inverter;

a first n channel MOSFET having a drain connected to the output terminal of the inverter, a gate connected to the input terminal of the inverter and a source; and a second n channel MOSFET having a drain connected to the source of the first n channel MOSFET, a gate connected to a control voltage node and a source connected to ground; and the charge pump comprises:

a first p channel MOSFET having a drain connected to the positive voltage supply, a gate connected to the bias voltage node and a source;

a second p channel MOSFET having a drain connected to the source of the first p channel MOSFET, a gate coupled to an output terminal of the phase detector and a source connected to the control voltage node;

a first n channel MOSFET having a drain connected to the control voltage node, a gate coupled to an output terminal of the phase detector and a source;

a second n channel MOSFET having a drain connected to the source of the first n channel MOSFET, a gate connected to the control voltage node and a source connected to ground; and a current mirror for setting the voltage of the bias voltage node.

10. A phase lock loop as defined in claim 9, wherein the filter network comprises:

an n channel MOSFET having a drain, a gate connected to the control voltage node and a source connected to ground; and a capacitor connected between the control voltage node and the drain of the n channel MOSFET.

11. A phase lock loop as defined in claim 9, wherein the filter network comprises:

a p channel MOSFET having a drain connected to the control voltage node, a gate connected to ground and a source; and a capacitor connected between the source of the channel MOSFET and ground.

12. A phase lock loop as defined in claim 9, wherein the filter network comprises:

an n channel MOSFET having a drain connected to the control voltage node, a gate connected to a bias circuit and a source; and a capacitor connected between the source of the n channel MOSFET and ground.

13. A phase lock loop as defined in claim 12, wherein the bias circuit is operable to bias the gate of the n channel MOSFET at a voltage approximately equal to twice the control voltage plus a threshold shift caused by operation of the source and substrate of the n channel MOSFET at different voltages.

14. A phase lock loop as defined in claim 1, wherein the loop filter comprises a pair of charge pumps and a filter network, each of the charge pumps being responsive to the control signal and to the control voltage to apply a charge indicative of both the phase difference and the control voltage to the filter network to develop the control voltage.

15. A phase lock loop as defined in claim 14, wherein:

the filter network comprises a resistive admittance and a capacitive admittance;

one of the charge pumps applies charge to the resistive admittance to determine a first order response of the phase lock loop; and another of the charge pumps applies charge to the capacitive admittance to determine a second order response of the phase lock loop.

16. A phase lock loop as defined in claim 15, wherein the filter network further comprises a voltage-to-current converter responsive to a voltage across the capacitive admittance to apply a current to the resistive admittance.

17. A phase lock loop as defined in claim 16, wherein the voltage-to-current converter has an exponential transconductance characteristic.

18. A phase lock loop as defined in claim 14, wherein the voltage controlled oscillator comprises d plurality of series connected inverters, each inverter comprising:

a first p channel MOSFET having a drain connected to a positive voltage supply, a gate connected to a bias voltage node and a source;

a second p channel MOSFET having a drain connected to the source of the first p channel MOSFET, a gate connected to an input terminal of the inverter and a source connected to an output terminal of the inverter;

a first n channel MOSFET having a drain connected to the output terminal of the inverter, a gate connected to the input terminal of the inverter and a source; and a second n channel MOSFET having a drain connected to the source of the first n channel MOSFET, a gate connected to a control voltage node and a source connected to ground; each charge pump comprises:

a first p channel MOSFET having a drain connected to the positive voltage supply, a gate connected to the bias voltage node and a source;

a second p channel MOSFET having a drain connected to the source of the first p channel MOSFET, a gate coupled to an output terminal of the phase detector and a source;

a first n channel MOSFET having a drain connected to the source of the second p channel MOSFET, a gate coupled to an output terminal of the phase detector and a source;

a second n channel MOSFET having a drain connected to the source of the first n channel MOSFET, a gate connected to the control voltage node and a source connected to ground; and a current mirror for setting the voltage the bias voltage node;

a first-of the charge pumps having the source of its second p channel MOSFET connected to the control voltage node, and a second of the charge pumps having the source of its second p channel MOSFET connected to an integrating node, and the filter network comprising:

a capacitor connected between the integrating node and ground;

an n channel MOSFET connected between the control voltage node and ground; and a voltage-to-current converter connected between the integrating node and the control voltage node.

19. A phase lock loop as defined in claim 18, wherein the current-to-voltage converter comprises:

a plurality of bipolar transistors in a Darlington configuration having a base connected to the integrating node, an emitter connected to ground; and a current mirror connected between a collector of the Darlington configuration and the control voltage node.

20. A method for operating a phase lock loop, comprising:

generating an output signal having a frequency which is responsive to a control voltage;

detecting a phase difference of the output signal and a reference signal; and applying a charge indicative of both the phase difference and the control voltage to a filter network to develop the control voltage.

21. A method as defined in claim 20, comprising varying an admittance of the filter network in response to the control voltage.

22. A method as defined in claim 21, comprising varying the charge applied to the filter network in response to the control voltage such that a given phase difference of the output signal and the reference signal causes a change in the frequency of the output signal which is approximately proportional to the frequency of the output signal.

23. A method as defined in claim 20, comprising generating current pulses for application to the filter network, the current pulses having a magnitude indicative of the control voltage and a duration and a direction indicative of the phase difference.

24. A method as defined in claim 23, comprising:

generating an output signal having a frequency which is responsive to the control voltage such that the frequency of the output signal has a particular functional dependence on the control voltage;

generating current pulses having a magnitude indicative of the control voltage such that the magnitude of the current pulses has a functional dependence on the control voltage which is substantially proportional to the functional dependence of the output signal frequency on the control voltage; and varying a resistive admittance of the filter network in response to the control voltage such that the resistive admittance has a functional dependence on the control voltage which is substantially proportional to the first derivative of the functional dependence of the output signal frequency on the control voltage.

25. A method as defined in claim 20, comprising applying identical charges indicative of both the phase difference and the control voltage to two distinct nodes of the filter network to develop the control voltage, a response of the filter network to one of the charges determining a first order response of the phase lock loop and a response of the filter network to the other of the charges determining a second order response of the phase lock loop.

* * * * *